US012001012B2

(12) United States Patent
Terzi et al.

(10) Patent No.: US 12,001,012 B2
(45) Date of Patent: Jun. 4, 2024

(54) PIEZOELECTRIC BASED MEMS DEVICE WITH TIME SHARING ACTUATION AND SENSING CIRCUITRY

(71) Applicants: STMicroelectronics S.r.l., Agrate Brianza (IT); STMicroelectronics Ltd, Netanya (IL)

(72) Inventors: Davide Terzi, Bergamo (IT); Gianluca Mendicino, Legnano (IT); Dadi Sharon, Givat Ada (IT)

(73) Assignees: STMicroelectronics S.r.l., Agrate Brianza (IT); STMicroelectronics Ltd, Netanya (IL)

(*) Notice: Subject to any disclaimer, the term of this patent is extended or adjusted under 35 U.S.C. 154(b) by 592 days.

(21) Appl. No.: 17/238,596

(22) Filed: Apr. 23, 2021

(65) Prior Publication Data

US 2022/0342205 A1 Oct. 27, 2022

(51) Int. Cl.
*G02B 26/10* (2006.01)
*B81B 3/00* (2006.01)
(Continued)

(52) U.S. Cl.
CPC .......... *G02B 26/101* (2013.01); *B81B 3/0021* (2013.01); *G02B 26/0858* (2013.01);
(Continued)

(58) Field of Classification Search
CPC .............. G02B 26/101; G02B 26/0858; G02B 26/0833; G09G 3/346; H02N 2/103;
(Continued)

(56) References Cited

U.S. PATENT DOCUMENTS 10,365,475 B2 7/2019 Carminati et al.
2005/0253055 A1 11/2005 Sprague et al.
(Continued)

FOREIGN PATENT DOCUMENTS

CN 108761773 A 11/2018

OTHER PUBLICATIONS

EP Search Report and Written Opinion for counterpart EP Appl. No. 22164034.5, report dated Aug. 22, 2022, 11 pgs.

*Primary Examiner* — Emily P Pham
(74) *Attorney, Agent, or Firm* — Crowe & Dunlevy LLC

(57) ABSTRACT

Disclosed herein is a microelectromechanical (MEMS) device, including a rotor and a first piezoelectric actuator mechanically coupled to the rotor. The first piezoelectric actuator is electrically coupled between a first signal node and a common voltage node. A second piezoelectric actuator is mechanically coupled to the rotor, and is electrically coupled between a second signal node and the common voltage node. Control circuitry includes a drive circuit configured to drive the first and second piezoelectric actuators, a sense circuit configured to process sense signals generated by the first and second pizeoelectric actuators, and a multiplexing circuit. The multiplexing circuit is configured to alternate between connecting the drive circuit to the first piezoelectric actuator while connecting the sense circuit to the second piezoelectric actuator, and connecting the drive circuit to the second piezoelectric actuator while connecting the sense circuit to the first piezoelectric actuator.

18 Claims, 3 Drawing Sheets

(51) Int. Cl.

| | |
|---|---|
| ***G02B 26/08*** | (2006.01) |
| ***G09G 3/34*** | (2006.01) |
| ***H02N 2/10*** | (2006.01) |
| ***H02N 2/14*** | (2006.01) |
| ***H03H 9/15*** | (2006.01) |
| ***H10N 30/20*** | (2023.01) |
| *H10N 30/853* | (2023.01) |

(52) U.S. Cl.
CPC ............. *G09G 3/346* (2013.01); *H02N 2/103* (2013.01); *H02N 2/145* (2013.01); *H03H 9/15* (2013.01); *H10N 30/204* (2023.02); *B81B 2201/032* (2013.01); *H10N 30/8554* (2023.02)

(58) Field of Classification Search
CPC .......... H02N 2/145; H02N 2/001; H02N 2/12; H02N 2/14; H10N 30/204; H10N 30/8554; H03H 9/15; B81B 3/0021; B81B 7/008; B81B 7/02; B81B 2201/032
See application file for complete search history.

(56) References Cited

U.S. PATENT DOCUMENTS

2016/0011393 A1 1/2016 Kim et al.
2016/0139083 A1* 5/2016 Castane Selga ....... G01N 29/12 310/90.5
2020/0192199 A1 6/2020 Boni et al.
2020/0310110 A1 10/2020 Carminati et al.
2022/0299771 A1* 9/2022 Yamada ............. G02B 26/0833

* cited by examiner

PIEZOELECTRIC BASED MEMS DEVICE WITH TIME SHARING ACTUATION AND SENSING CIRCUITRY

TECHNICAL FIELD

This disclosure is related to the field of microelectromechanical systems (MEMS) devices and, in particular, to a MEMS device utilizing the same piezoelectric device having the function of both actuator and sensor, time shared between driving and sensing circuitry.

BACKGROUND

Microelectromechanical systems (MEMS) devices, such as mirrors, are used in portable devices like virtual or augmented reality headsets, laser beam scanner, and distance measuring devices.

For instance, FIG. 1 is a schematic illustration of a laser beam scanner 9 comprising a light source 1, such as a laser source generating a combined light beam 2 formed of three monochromatic light beams, one for each basic color that, through an optical system 3, is deflected by a mirror apparatus 5 (which may be one biaxial mirror or two mono-axial mirrors) toward an exit window 6. In the illustrated example, the mirror element 5 is mono-axial, controlled so as to turn about a vertical axis A and a horizontal axis B. Rotation of the mirror apparatus 5 about the vertical axis A generates a horizontal scan. If the mirror apparatus 5 includes a second mono-axial mirror rotatable about a horizontal axis B, or if the mirror apparatus 5 is a biaxial mirror, rotation of the mirror apparatus 5 about the horizontal axis B, perpendicular to the vertical axis A, would generate a vertical scan.

With additional reference to FIG. 2, rotation of the mirror apparatus 5 about the vertical axis A (and the horizontal axis B, if the mirror apparatus 5 is so capable) may be accomplished by piezoelectric actuation, and the combination of the horizontal scan and vertical scan serves to reflect the combined light beam 2 across the exit window 6 in a scan pattern 7 that, when perceived by the human eye, produces viewable images and video. If the light source were to emit non-visible light, such as an infrared laser beam, then the scan pattern 7 would not be perceptible by the human eye, but would still be as desired in order to achieve an intended function. Also note that, when the mirror apparatus 5 is mono-axial, it serves to reflect the light across the exit window 6 in a one dimensional pattern.

In order to determine whether the scan pattern 7 produced matches the intended and desired scan pattern, the mirror apparatus 5 has one or more position sensors associated therewith that allow detection of the amount of deflection of the mirror apparatus 5 along the vertical axis A (and horizontal axis B, if the mirror apparatus 5 is so capable) in positive and negative directions. The information provided by these sensors is used by drive circuitry for the piezoelectric devices actuating the mirror apparatus 5, or by control circuitry instructing the drive circuitry, as feedback to adjust the driving of the mirror apparatus 5 so as to help ensure that the scan pattern 7 produced matches the intended and desired scan pattern.

However, the use of such dedicated sensors, as well as the provision of the pads and electrical connections associated with such sensors, consumes on-die space that would preferably be spent on other components, or simply eliminated so as to save cost or produce a smaller die. This said, the feedback information provided by such sensors is valuable, as described above. As such, further development into designs providing for such sensing while consuming less space and reducing manufacturing cost is needed.

SUMMARY

Disclosed herein is a microelectromechanical (MEMS) device, including a rotor and a piezoelectric actuator mechanically coupled to the rotor, the piezoelectric actuator being electrically coupled between a signal node and a reference node. The MEMS device has control circuitry, which includes mirror drive circuitry configured to generate drive pulses for the piezoelectric actuator on the signal node, sense circuitry configured to receive sense signals from the piezoelectric actuator, and a multiplexing circuit. The multiplexing circuit is configured to couple the drive pulses generated for the piezoelectric actuator to the piezoelectric actuator for a first portion of a movement cycle in order to cause deflection of the rotor, and couple the sense signals received from the piezoelectric actuator to the sense circuitry during a second portion of the movement cycle.

The sense circuitry may include current to voltage conversion circuitry configured to convert the sense signals to voltage signals.

The control circuitry may also include processing circuitry configured to generate control signals for the mirror drive circuitry in response to the sense signals, with the control signals adjusting properties of the drive pulses for the piezoelectric actuator.

A semiconductor body may have a cavity defined therein, with the rotor being suspended over the cavity by the piezoelectric actuator.

The piezoelectric actuator may be formed of lead zirconate titanate (PZT) or doped lead zirconate titanate (PZT).

In another embodiment, a MEMS device may include a rotor and a first plurality of piezoelectric actuators mechanically coupled to the rotor, with the first plurality of piezoelectric actuators being electrically coupled between a first signal node and a common voltage node. The MEMS device may also include a second plurality of piezoelectric actuators mechanically coupled to the rotor, the second plurality of piezoelectric actuators being electrically coupled between a second signal node and a common voltage node. The MEMS device may have control circuitry including mirror drive circuitry configured to alternatingly generate drive pulses for the first plurality of piezoelectric actuators on the first signal node and the second plurality of piezoelectric actuators on the second signal node, sense circuitry configured to alternatingly receive sense signals from the second plurality of piezoelectric actuators and the first plurality of piezoelectric actuators, a first multiplexing circuit configured to couple the drive pulses generated for the second plurality of piezoelectric actuators to the second plurality of piezoelectric actuators simultaneously with a second multiplexing circuit coupling the sense signals received from the first plurality of piezoelectric actuators to the sense circuitry, and the second multiplexing circuit may be configured to couple the drive pulses generated for the first plurality of piezoelectric actuators to the first plurality of piezoelectric actuators simultaneously with the first multiplexing circuit coupling the sense signals received from the second plurality of piezoelectric actuators to the sense circuitry.

The first plurality of piezoelectric actuators may include a first pair of piezoelectric actuators mechanically coupled to opposite sides of the rotor, and the second plurality of piezoelectric actuators may include a second pair of piezoelectric actuators also mechanically coupled to the opposite sides of the rotor.

The sense circuitry may include current to voltage conversion circuitry configured to convert the sense signals to voltage signals.

The control circuitry may also include processing circuitry configured to generate control signals for the mirror drive circuitry in response to the sense signals, wherein the control signals adjust properties of the drive pulses for the first plurality of piezoelectric actuators and the drive pulses for the second plurality of piezoelectric actuators.

The control circuitry may further include synchronization circuitry configured to control the first and second multiplexing circuits so as to effectuate the first multiplexing circuit coupling the drive pulses generated for the second plurality of piezoelectric actuators to the second plurality of piezoelectric actuators simultaneously with the second multiplexing circuit coupling the sense signals received from the first plurality of piezoelectric actuators to the sense circuitry, and the second multiplexing circuit coupling the drive pulses generated for the first plurality of piezoelectric actuators to the first plurality of piezoelectric actuators simultaneously with the first multiplexing circuit coupling the sense signals received from the second plurality of piezoelectric actuators to the sense circuitry.

The control circuitry may also include common mode voltage generation circuitry configured to generate a common mode voltage at the common voltage node.

A semiconductor body may have a cavity defined therein, and the rotor may be suspended over the cavity by the first and second pluralities of piezoelectric actuators.

The first and second pluralities of piezoelectric actuators may be comprised of lead zirconate titanate (PZT) or doped lead zirconate titanate (PZT).

A method aspect described herein includes electrically coupling driving circuitry to a first plurality of piezoelectric actuators while simultaneously electrically coupling a second plurality of piezoelectric actuators to sense circuitry, during a first half period, and electrically coupling driving circuitry to the second plurality of piezoelectric actuators while simultaneously electrically coupling the first plurality of piezoelectric actuators to the sense circuitry, during a second half period.

The method may further include using the drive circuitry to generate drive pulses for the first plurality of piezoelectric actuators and using the sense circuitry to detect deflection of a rotor mechanically coupled to the first and second pluralities of piezoelectric actuators, during the first half period, and using the drive circuitry to generate drive pulses for the second plurality of piezoelectric actuators and using the sense circuitry to detect deflection of the rotor, during the second half period.

The method may further include adjusting the drive pulses for the first plurality of piezoelectric actuators based upon the deflection of the rotor during the first half period, and adjusting the drive pulses for the second plurality of piezoelectric actuators based upon the deflection of the rotor during the second half period.

DETAILED DESCRIPTION

The following disclosure enables a person skilled in the art to make and use the subject matter disclosed herein. The general principles described herein may be applied to embodiments and applications other than those detailed above without departing from the spirit and scope of this disclosure. This disclosure is not intended to be limited to the embodiments shown, but is to be accorded the widest scope consistent with the principles and features disclosed or suggested herein.

Figure 1:
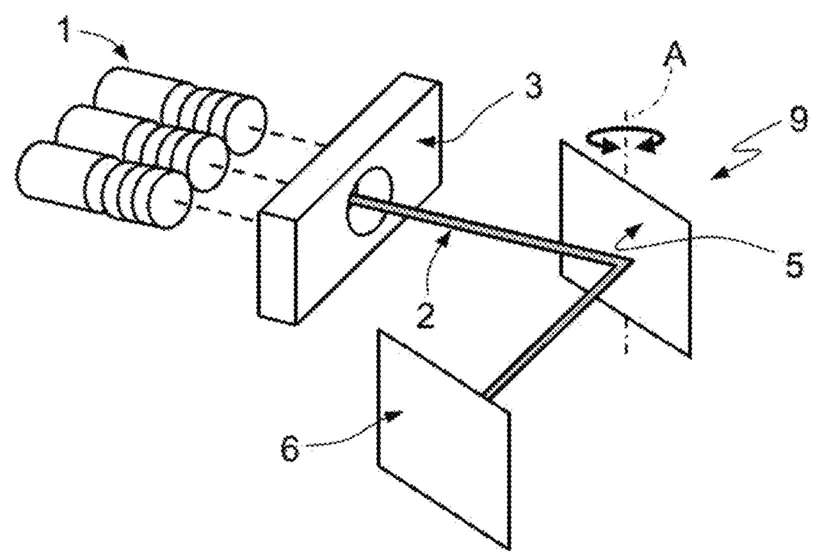
FIG. 1 is a diagrammatical representation of a prior art laser beam scanner.
Figure 2:
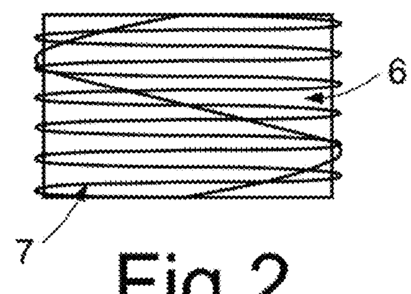
FIG. 2 is a diagrammatical representation of the scan pattern produced by the prior art laser beam scanner of FIG. 1 as it scans an incident light beam across the exit window.
Figure 3:
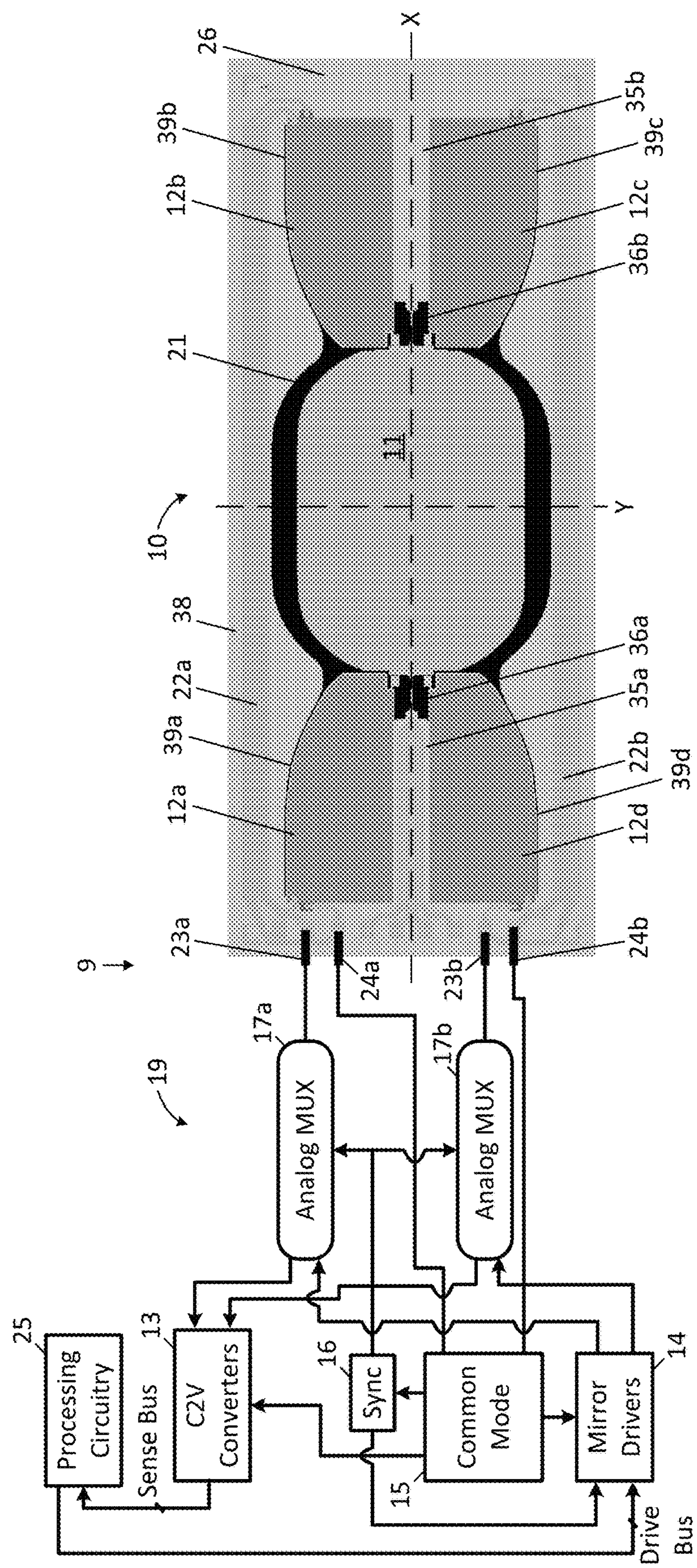
FIG. 3 is a block diagram of control and drive circuitry described herein for a MEMS device.

Now described with reference to FIG. 3 is a microelectromechanical (MEMS) device 9, including a MEMS mirror 10 and control circuitry 19 for the MEMS mirror 10. As will be explained in detail below, the MEMS mirror 10 utilizes the same piezoelectric regions as both actuators and position sensors. In some applications, the MEMS mirror may lack dedicated position sensors.

More particularly, the MEMS mirror 10 is formed in a semiconductor body 21, and includes a rotor 11 covered with a reflective material and having a main extension in a horizontal plane XY and being rotatable about a first axis of symmetry X parallel to the horizontal plane XY. A second axis of symmetry Y is orthogonal to the first axis of symmetry X, and defines, together with the first axis of symmetry X, the horizontal plane XY.

Further details of the MEMS mirror 10 will now be given, but do note that the specifics of this MEMS mirror 10 illustrated and described are not intended to be limiting, and the techniques described herein are applicable to a MEMS mirror 10 having a rotor and/or reflective surface of any shape (e.g., circular, rectangular, etc).

The rotor 11 is suspended above a cavity 21 defined in the semiconductor body 26, and has, in the embodiment illustrated, a generically elliptical shape in the horizontal plane XY, with major axis arranged along the first axis of symmetry X. The rotor 11 is elastically coupled to a fixed structure 38, defined in the same semiconductor body 26. In particular, the fixed structure 38 forms, in the horizontal plane XY, a frame that delimits and surrounds the cavity 21 and moreover has a first supporting element 35*a* and a second supporting element 35*b*, which extend longitudinally along the first axis of symmetry X within the cavity 21 starting from the same frame, on opposite sides of the rotor 11.

The rotor 11 is supported by the first and the second supporting elements 35*a* and 35*b*, to which it is elastically coupled by a first elastic suspension element 36*a* and a second elastic suspension element 36*b*, which have a high stiffness to movement out of the horizontal plane XY (along an orthogonal axis Z, transverse to the horizontal plane XY) and are compliant to torsion about the first axis X). The first and second elastic suspension elements 36*a* and 36*b* extend along the first axis of symmetry X, between the supporting element 35*a* and a first side of the rotor 11, and between the supporting element 35*b* and a second side of the rotor 11.

In the embodiment illustrated, the first and the second elastic suspension elements 36*a* and 36*b* are of a folded type, i.e., they are formed by a plurality of arms having a longitudinal extension parallel to the first axis X, connected two by two at the ends by connecting elements (having an extension parallel to the second horizontal axis Y). The first and the second elastic suspension elements 36*a* and 36*b* couple the rotor 11 to the fixed structure 38, enabling rotation thereof about the first axis X.

Driving arms 39*a*-39*d* help attach the rotor 11 to the fixed portion 38. The driving arms 39*a* and 39*d* are arranged on opposite sides of, and symmetric with respect to, the first axis X; similarly, the driving arms 39*b* and 39*c* are arranged on opposite sides of, and symmetric with respect to, the first axis X. The driving arms 39*a*, 39*d* and the driving arms 39*b*, 39*c* are arranged on opposite sides of, and symmetric with respect to, the second axis Y. The driving arms 39*a*-39*d* each have a longitudinal extension parallel to the first axis X and parallel to the supporting elements 35*a* and 35*b*.

The driving arms 39*a*-39*d* each have a generically trapezoidal (or fin-like) shape, with a major side directed parallel to the first axis X, with a minor side directed parallel to the second axis Y, and being fixedly coupled to the frame of the fixed structure 38. Each driving arm 39*a*-39*d* is suspended above the cavity 21 and carries, on a top surface thereof opposite to the cavity 21, a respective piezoelectric region 12*a*-12*d*. The piezoelectric regions 12*a*-12*d* may be formed of lead zirconate titanate (PZT) or doped lead zirconate titanate or another suitable piezoelectric material, and have substantially the same extension in the horizontal plane XY as the driving arms 39*a*-39*d*.

The piezoelectric regions 12*a* and 12*b* are electrically connected through metal traces 22*a* between a signal pad 23*a* and a common mode voltage pad 24*a*, and the piezoelectric regions 12*c* and 12*d* are electrically connected through metal traces 22*b* between a signal pad 23*b* and a common mode voltage pad 24*b*.

The control circuitry 19 includes a first analog multiplexer 17*a* electrically connected to signal pad 23*a* and a second analog multiplexer 17*b* electrically connected to signal pad 23*b*. Mirror driver circuits 14 receive input over a drive bus and provide, as output, drive signals to the analog multiplexers 17*a* and 17*b*. Transimpedance amplifiers (e.g., current to voltage converters) 13 receive output from the analog multiplexers 17*a* and 17*b* as input, and provide output to a sense bus. A synchronization circuit 16 provides control signals for the analog multiplexers 17*a* and 17*b*, as well as the mirror drivers 14. A common mode voltage generation circuit 15 provides a common mode voltage to the common mode voltage pads 24*a* and 24*b*, as well as to the mirror drivers 14 and synchronization circuit 16.

Figure 4:
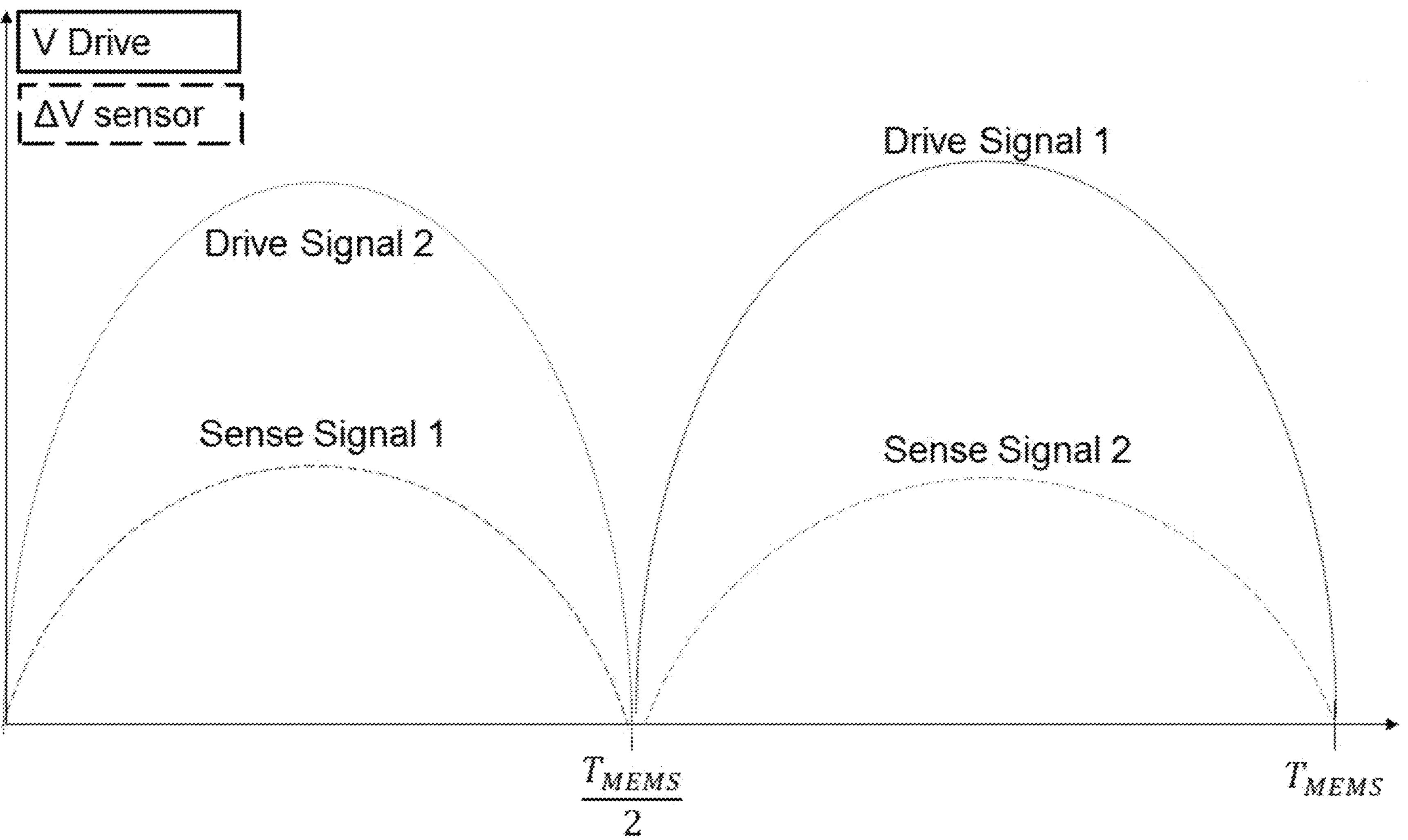
FIG. 4 contains graphs of the first and second drive signals, and first and second sense signals, used by the control and drive circuitry of FIG. 3 for driving of the MEMS device and sensing of the position of the MEMS device.

With additional reference to FIG. 4, operation of the MEMS device 9 will now be described. During a given time period Tmems, the drive signals will be alternatingly pulsed, with each pulse lasting for one half the given time period Tmems/2. While the first drive signal is pulsed and fed by the analog multiplexer 17*b* (in response to the control signal from the synchronization circuit 16) to the piezoelectric regions 12*c* and 12*d* to drive said piezoelectric regions to cause deflection of the rotor 11 about the X-axis, a sense signal is passed from the piezoelectric regions 12*a* and 12*b* to the sense bus by the analog multiplexer 17*a* (in response to the control signal from the synchronization circuit 16); conversely, while the second drive signal is pulsed and fed by the analog multiplexer 17*a* (in response to the control signal from the synchronization circuit 16) to the piezoelectric regions 12*a* and 12*b* to drive said piezoelectric regions to cause deflection of the rotor 11, a sense signal is passed from the piezoelectric regions 12*c* and 12*d* to the sense bus by the analog multiplexer 17*b* (in response to the control signal from the synchronization circuit 16).

This operation is possible due: (1) to the nature of piezoelectric materials, which change shape (e.g., contract) when voltage is applied thereto and generate a voltage when mechanically changed in shape (e.g., contract when caused to do so by forced externally), and (2) the time sharing of the piezoelectric regions 12*a*-12*d* by the control circuitry 19 (e.g., while a drive voltage is applied to piezoelectric regions 12*a* and 12*b*, which in turn causes deflection of the rotor 11 and consequent stretching of the piezoelectric regions 12*c* and 12*d*, a sense signal is read from piezoelectric regions 12*c* and 12*d*; and while a drive voltage is applied to piezoelectric regions 12*c* and 12*d*, which in turn causes deflection of the rotor 11 and consequent stretching of the piezoelectric regions 12*a* and 12*b*, a sense signal is read from piezoelectric regions 12*a* and 12*b*).

The sense signal is read by processing circuitry 25 and used as feedback for generating and adjusting control signals to the mirror drivers 14 over the drive bus, thereby allowing the processing circuitry 25 to help ensure that the degree of deflection by the rotor 11 in each direction matches the desired degree of deflection.

As can be appreciated from the description above, the MEMS device 9 provides for the same feedback (sense signal from the piezoelectric regions 12*a*-12*d*) as prior art MEMS devices which utilize dedicated position sensors, yet does so without the use of such dedicated position sensors, saving space on the semiconductor body 21. This also reduces the number of pins and routing conductors, further saving space.

While the above has been described with reference to a MEMS device 9 having the illustrated and described four piezoelectric regions 12*a*-12*d*, understand that there may be any number of piezoelectric regions (for example, there may be only one piezoelectric region, or there may be more than one piezoelectric region) of any shape and of any placement. Regardless, the same principles apply, where the movement cycle of the MEMS device for each piezoelectric region is divided into a driving phase (during which the piezoelectric region is connected to the drive circuit) and a sensing phase (during which the piezoelectric region is connected to the sense circuit), with it being understood that where there are multiple piezoelectric regions, their driving phases and sensing phases may be in phase or in anti-phase to one another depending upon their location about the rotor.

Also understand that this time sharing and division may be applied to other MEMS device types, for example to electrostatically actuated MEMS devices. In such a case, the movement cycle for the MEMS device is still divided into a driving phase (during which the drive circuit is connected to the stator or rotor) and a sensing phase (during which the sense circuit is connected to the stator or rotor).

While the disclosure has been described with respect to a limited number of embodiments, those skilled in the art, having benefit of this disclosure, will appreciate that other embodiments can be envisioned that do not depart from the scope of the disclosure as disclosed herein. Accordingly, the scope of the disclosure shall be limited only by the attached claims.

The invention claimed is:

1. A microelectromechanical (MEMS) device, comprising:

a rotor;

a first plurality of piezoelectric actuators mechanically coupled to the rotor, the first plurality of piezoelectric actuators being electrically coupled between a first signal pad and a common mode voltage pad;

a second plurality of piezoelectric actuators mechanically coupled to the rotor, the second plurality of piezoelectric actuators being electrically coupled between a second signal pad and the common mode voltage pad; and a control circuitry, comprising:

mirror drive circuitry configured to alternatingly generate drive pulses for the first plurality of piezoelectric actuators on the first signal pad and the second plurality of piezoelectric actuators on the second signal pad;

sense circuitry configured to alternatingly receive sense signals from the second plurality of piezoelectric actuators and the first plurality of piezoelectric actuators;

a first multiplexing circuit configured to couple the drive pulses generated for the second plurality of piezoelectric actuators to the second plurality of piezoelectric actuators simultaneously with a second multiplexing circuit coupling the sense signals received from the first plurality of piezoelectric actuators to the sense circuitry; and wherein the second multiplexing circuit configured to couple the drive pulses generated for the first plurality of piezoelectric actuators to the first plurality of piezoelectric actuators simultaneously with the first multiplexing circuit coupling the sense signals received from the second plurality of piezoelectric actuators to the sense circuitry.

2. The MEMS device of claim 1, wherein the first plurality of piezoelectric actuators includes a first pair of piezoelectric actuators mechanically coupled to opposite sides of the rotor; and wherein the second plurality of piezoelectric actuators includes a second pair of piezoelectric actuators also mechanically coupled to the opposite sides of the rotor.

3. The MEMS device of claim 1, wherein the sense circuitry comprises current to voltage conversion circuitry configured to convert the sense signals to voltage signals.

4. The MEMS device of claim 1, wherein the control circuitry further comprises processing circuitry configured to generate control signals for the mirror drive circuitry in response to the sense signals, wherein the control signals adjust properties of the drive pulses for the first plurality of piezoelectric actuators and the drive pulses for the second plurality of piezoelectric actuators.

5. The MEMS device of claim 1, wherein the control circuitry further comprises synchronization circuitry configured to control the first and second multiplexing circuits so as to effectuate the first multiplexing circuit coupling the drive pulses generated for the second plurality of piezoelectric actuators to the second plurality of piezoelectric actuators simultaneously with the second multiplexing circuit coupling the sense signals received from the first plurality of piezoelectric actuators to the sense circuitry, and the second multiplexing circuit coupling the drive pulses generated for the first plurality of piezoelectric actuators to the first plurality of piezoelectric actuators simultaneously with the first multiplexing circuit coupling the sense signals received from the second plurality of piezoelectric actuators to the sense circuitry.

6. The MEMS device of claim 1, wherein the control circuitry further comprises common mode voltage generation circuitry configured to generate a common mode voltage at the common mode voltage pad.

7. The MEMS device of claim 1, further comprising a semiconductor body having a cavity defined therein, wherein the rotor is suspended over the cavity by the first and second pluralities of piezoelectric actuators.

8. The MEMS device of claim 1, wherein the first and second pluralities of piezoelectric actuators are comprised of lead zirconate titanate (PZT) or doped lead zirconate titanate (PZT).

9. A microelectromechanical (MEMS) device, comprising:

a rotor;

a first piezoelectric actuator mechanically coupled to the rotor, the first piezoelectric actuator being electrically coupled between a first signal pad and a common mode voltage pad;

a second piezoelectric actuator mechanically coupled to the rotor, the second piezoelectric actuator being electrically coupled between a second signal pad and the common mode voltage pad; and a control circuitry, comprising:

a drive circuit configured to drive the first and second piezoelectric actuators;

a sense circuit configured to process sense signals generated by the first and second piezoelectric actuator; and a multiplexing circuit configured to alternate between connecting the drive circuit to the first piezoelectric actuator while connecting the sense circuit to the second piezoelectric actuator, and connecting the drive circuit to the second piezoelectric actuator while connecting the sense circuit to the first piezoelectric actuator.

10. The MEMS device of claim 9, wherein the first piezoelectric actuator and second piezoelectric actuator are mechanically coupled to a same side of the rotor but across an axis of the rotor from one another.

11. The MEMS device of claim 9, wherein the sense circuit comprises current to voltage conversion circuitry configured to convert the sense signals to voltage signals.

12. The MEMS device of claim 9, wherein the control circuitry further comprises processing circuitry configured to generate control signals for the drive circuit in response to the sense signals, wherein the control signals adjust properties of the driving of the first and second piezoelectric actuators by the drive circuit.

13. The MEMS device of claim 9, wherein the first and second piezoelectric actuators are comprised of lead zirconate titanate (PZT) or doped lead zirconate titanate (PZT).

14. A microelectromechanical (MEMS) device, comprising:

a rotor;

a piezoelectric actuator mechanically coupled to the rotor, the piezoelectric actuator being electrically coupled between a signal node and a reference node; and control circuitry, comprising:

mirror drive circuitry configured to generate drive pulses for the piezoelectric actuator on the signal node;

sense circuitry configured to receive sense signals from the piezoelectric actuator; and a multiplexing circuit configured to:

couple the drive pulses generated for the piezoelectric actuator to the piezoelectric actuator for a first portion of a movement cycle in order to cause deflection of the rotor; and couple the sense signals received from the piezoelectric actuator to the sense circuitry during a second portion of the movement cycle.

15. The MEMS device of claim 14, wherein the sense circuitry comprises current to voltage conversion circuitry configured to convert the sense signals to voltage signals.

16. The MEMS device of claim 14, wherein the control circuitry further comprises processing circuitry configured to generate control signals for the mirror drive circuitry in response to the sense signals, wherein the control signals adjust properties of the drive pulses for the piezoelectric actuator.

17. The MEMS device of claim 14, further comprising a semiconductor body having a cavity defined therein, wherein the rotor is suspended over the cavity by the piezoelectric actuator.

18. The MEMS device of claim 14, wherein the piezoelectric actuator is comprised of lead zirconate titanate (PZT) or doped lead zirconate titanate (PZT).

* * * * *